United States Patent
Wu

(10) Patent No.: US 7,471,127 B2
(45) Date of Patent: Dec. 30, 2008

(54) LINEAR CHARGE PUMP FOR FRACTIONAL SYNTHESIS USING AN AUXILIARY CHARGE PUMP

(75) Inventor: Stephen Wu, Fountain Valley, CA (US)

(73) Assignee: Broadcom Corporation, Irvine, CA (US)

( * ) Notice: Subject to any disclaimer, the term of this patent is extended or adjusted under 35 U.S.C. 154(b) by 770 days.

(21) Appl. No.: 10/846,860

(22) Filed: May 17, 2004

(65) Prior Publication Data

US 2005/0253634 A1    Nov. 17, 2005

(51) Int. Cl.
*H03L 7/06* (2006.01)

(52) U.S. Cl. ...................................... 327/157

(58) Field of Classification Search ................. 327/148, 327/157, 147, 156; 331/17
See application file for complete search history.

(56) References Cited

U.S. PATENT DOCUMENTS

| 5,886,551 | A * | 3/1999 | Narahara ..................... 327/157 |
| 6,771,729 | B1 * | 8/2004 | Takahashi et al. ........... 375/376 |
| 6,826,248 | B2 * | 11/2004 | Kushibe ...................... 375/376 |
| 2003/0107419 | A1 * | 6/2003 | Park ........................... 327/157 |

* cited by examiner

*Primary Examiner*—Quan Tra
(74) *Attorney, Agent, or Firm*—Squire, Sanders & Dempsey, LLP

(57) ABSTRACT

A charge pump in a PLL incorporates interlinked first and second charge pumps that inject or withdraw a charge from a loop filter. The charge is proportional to a phase difference between a VCO and reference clock in the PLL.

5 Claims, 5 Drawing Sheets

LINEAR CHARGE PUMP FOR FRACTIONAL SYNTHESIS USING AN AUXILIARY CHARGE PUMP

BACKGROUND

1. Technical Field

This invention relates generally to charge pump circuits, and more particularly, but not exclusively, to charge pumps with improved linearity.

2. Description of the Related Art

Phase locked loops (PLLs) operate on the phase difference between a reference (crystal) clock and an oscillation (VCO) clock. A charge pump (CP) outputs a current to a loop filter that is proportional to the phase difference between these two clocks. In the locked state, the voltage at the charge pump output is a DC value that allows the VCO to oscillate at the desired frequency, because the loop filter suppresses the high-frequency components of the charge pump output.

However, nonlinearity in a phase frequency detector and CP results in higher noise and possibly spurious content in the VCO output spectrum, thereby affecting the PLL's accuracy. In the case of fractional-N PLLs, the nonlinearity folds modulation noise from a delta sigma modulator back into the loop filter bandwidth. Linearity in a CP is generally limited by power consumption.

Accordingly, a new CP is needed is that decreases nonlinearity without a significant increase in power consumption, thereby improving phase noise of the output clock.

SUMMARY

Embodiments of the invention include a first charge pump interlinked with an auxiliary charge pump, which improves the linearity of the charge pump current by improving the accuracy of the amount of charge charged or discharged by the CP as a proportion of the phase difference between reference and oscillation clocks. Improving the CP linearity improves the phase noise of the output clock.

In an embodiment of the invention, a system comprises a first and a second interlinked charge pump and a current source that is coupled to the first pump and second pumps. The current source supplies an auxiliary bias current that may be less than an input current of the first pump. The charge pumps generate a charge proportional to a phase difference between a VCO and a reference clock in a PLL.

In an embodiment of the invention, a method comprises: providing a first and a second interlinked charge pump; supplying an auxiliary bias current at the first pump that may be less than an input current of the first pump; and generating a charge proportional to a phase difference between a VCO and a reference clock in a PLL.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

The following description is provided to enable any person having ordinary skill in the art to make and use the invention, and is provided in the context of a particular application and its requirements. Various modifications to the embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles, features and teachings disclosed herein.

Figure 1:
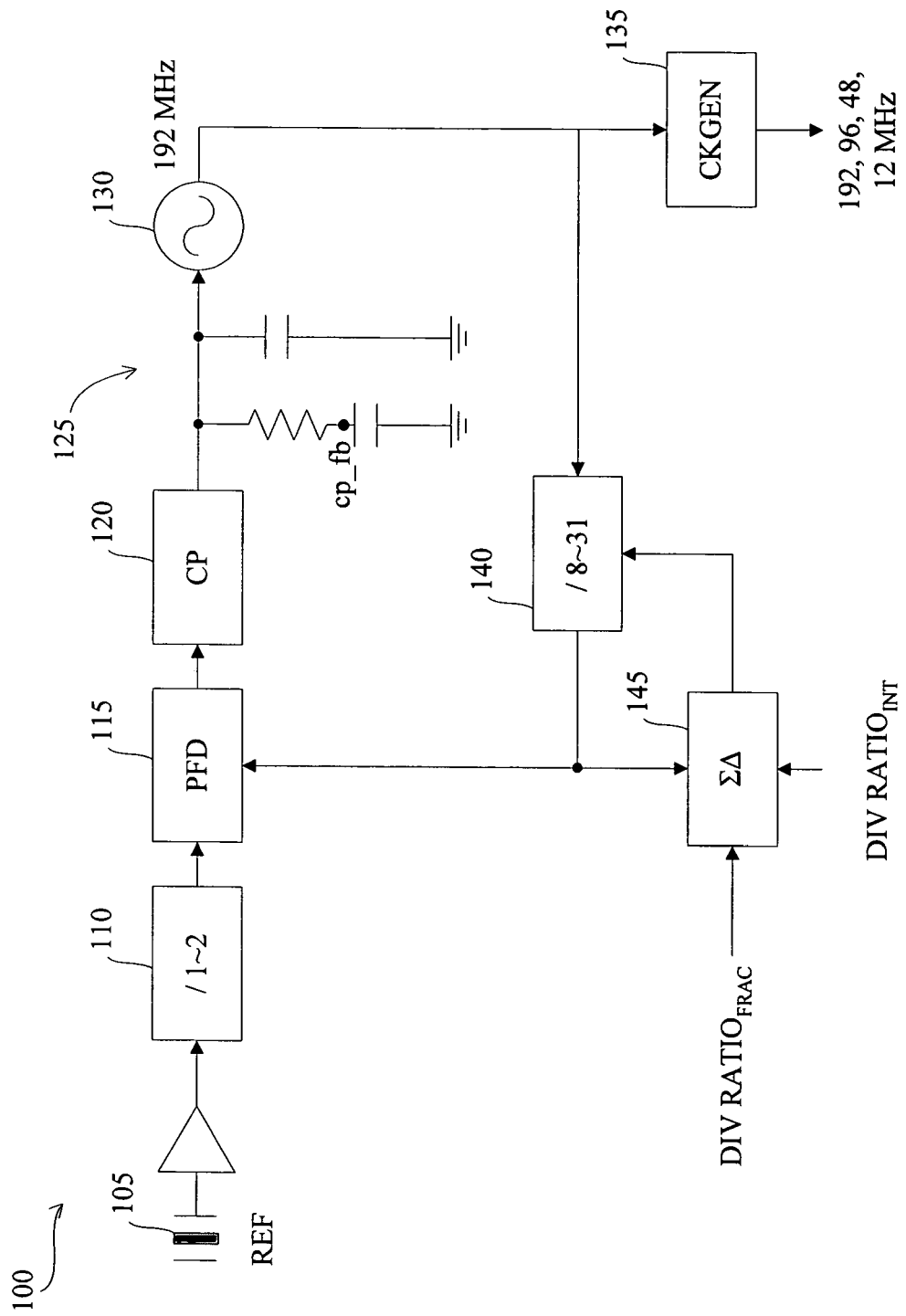
FIG. 1 is a block diagram illustrating a PLL according to an embodiment of the invention.

FIG. 1 is a block diagram illustrating a PLL 100 according to an embodiment of the invention. A reference oscillator 105 is coupled to a divide by circuit 110, which is coupled to a phase frequency detector (PFD; or phase comparator) 115. The PFD 115 is coupled to a charge pump 120, which is coupled to a loop filter 125. The loop filter 125 is coupled to a voltage-controlled oscillator (VCO) 130, which is coupled to a divide by circuit 140, which feeds back into the PFD 115. Also coupled to the PFD 115 is a sigma delta modulator 145, which is also coupled to the divide by circuit 140. The VCO 130 is also coupled to a clock generator (CKGEN) 135 for output.

During operation of the PLL 100, the output of the VCO 130 is pass through the divide by circuit 140, which is programmable. The output of the divide by circuit 140 is locked by the PFD 115 to the signal generated by the reference clock 105. As long as the output by from the divide by circuit 140 is exactly on the reference clock 105 frequency, the two signals are in phase and the output of PFD 115 is therefore ideally 0 volts DC.

However, if there is a phase or frequency shift between the output of the divide by circuit 140 and the reference clock 105 frequency, the PFD 115 produces an error voltage proportional to the difference between the signals. The error voltage can be either positive or negative based on whether the divide by circuit 140 output has drifted higher or lower in frequency than the reference clock 105 frequency. The error voltage is applied to the VCO 130, which generates a corrected frequency (i.e., opposite to the drift) based on the error voltage.

In an embodiment of the invention, the charge pump 120 outputs a current to the loop filter 125 that is proportional to the phase difference between these two clocks (i.e., the reference clock 105 and the VCO 130). In the locked state, the voltage at the charge pump 120 output settles around a DC value that allows the VCO 130 to oscillate at the desired frequency, because the loop filter 125 suppresses the high-frequency components of the charge pump 120 output.

In an embodiment of the invention in which the PLL 100 includes a fractional-N PLL, the VCO 130 oscillation frequency may be a fractional multiple of the reference clock 105 (as opposed to integer-N PLL's, where the VCO 130 frequency must be an integer multiple of the reference clock 105). One embodiment employs a multi-modulus divider, where the divide ratio may change for each reference cycle and the average divide ratio over time gives the fractional divide ratio. If the divide ratio is changed in a periodic cycle, fractional spurs are present at the VCO output 135. The delta sigma modulator 145 randomizes the divide ratio over time to provide the same average divide ratio. By using the delta sigma modulator 145 the noise spectrum is shaped so that most of the energy is moved to larger frequency offsets, where the loop filter 125 provides adequate suppression.

Figure 2:
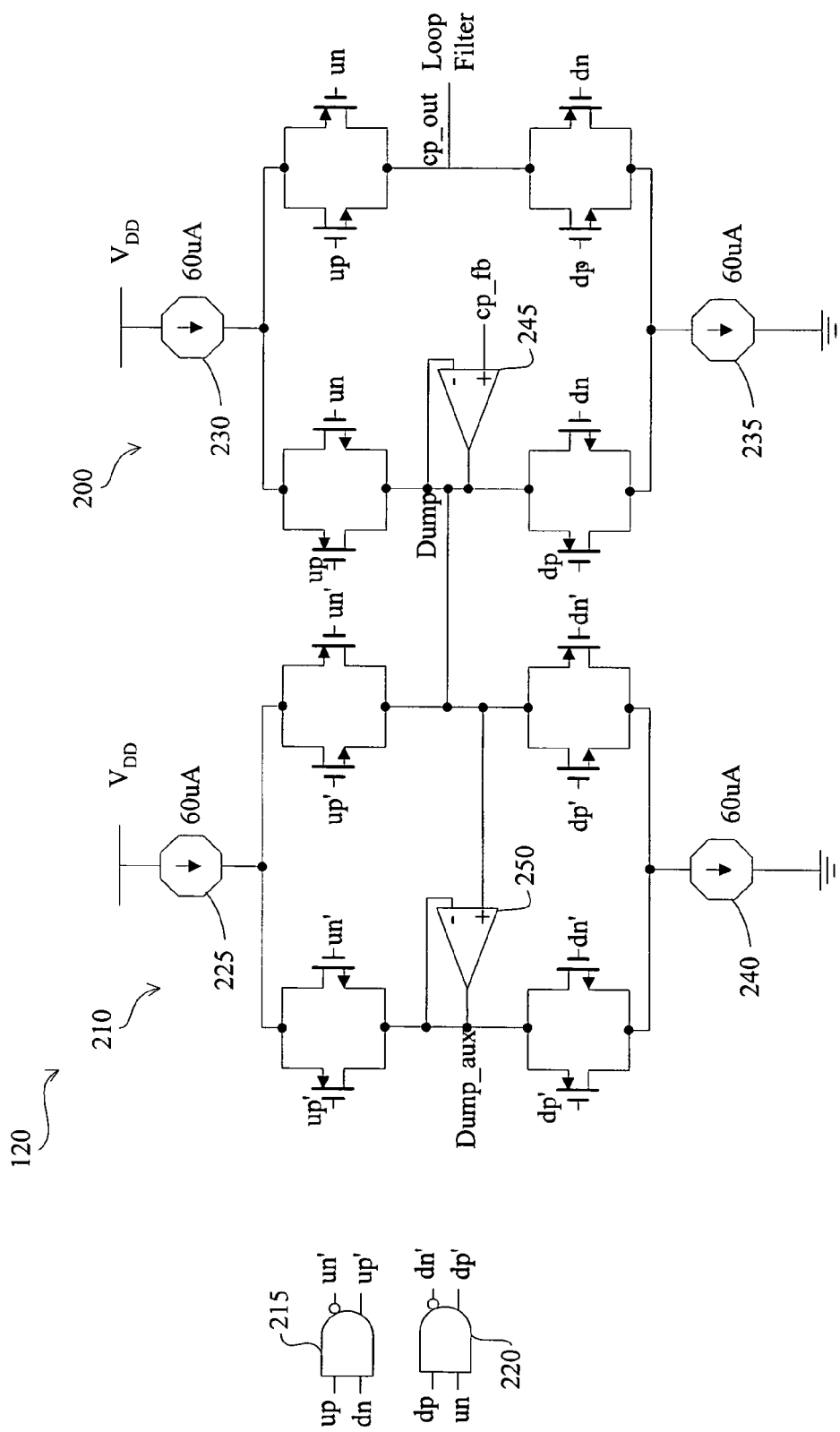
FIG. 2 is a block diagram illustrating a charge pump of the PLL.

FIG. 2 is a block diagram illustrating the charge pump 120 of the PLL 100. The charge pump 120 comprises a first or primary pump 200 and a second or auxiliary pump 210. Adding the second pump 210 to the charge pump 120 improves linearity without a large increase in power (e.g., less than twice in some instances). Total current for the charge pump 120 can be about 300 uA in one embodiment. In contrast, a conventional charge pump might require 3-5 times as much power to acquire the same linearity and still might yield voltage dropouts.

Each pump 200 and 210 comprise a plurality of switches and are interlinked via a Dump node. Current sources 225, 230, 235, and 240 of the first and second charge pumps 200 and 210 are always on. An opamp 245 in the first pump 200 reduces charge sharing and has a bias current less than the current sources 225 and 230 (e.g., 10-50 uA). In contrast, in a conventional charge pump, the opamp must supply a current several times the current source 225. For each charge pump, the switches steer the current to either the left or right side, like a differential pair. The current flows through the first or second charge pump 200 or 210 in a manner to provide an accurate amount of charge injected to or drawn from the loop filter 125, to which the first charge pump 200 is coupled. This amount of charge is proportional to the phase difference between the reference clock 105 and the oscillating clock 130.

The switches of the primary charge pump 200 are controlled directly by the PFD 115 output, i.e., the phase difference between the reference clock 105 and the oscillating clock 130. The switches of the second charge pump 210 are controlled by the AND gates 215 and 200. The AND gates 215 and 200 ensure that the voltage at the node Dump is held close to the voltage at cp_fb by always providing a current path to the power supply or ground when there is a phase difference between the up and dp pulses (meaning, when the loop filter 125 is being charged or discharged, if there was no second charge pump 210, the node Dump would be discharged or charged and therefore its voltage would drift away from cp_fb, unless the opamp could source or sink an equivalent amount of current). Also, the delay inherent in the AND gates 215 and 220 and in the PFD 115 reset pulse ensures that current from the second charge pump 210 is never directly injected to or drawn from the loop filter 125.

To maintain CP 120 linearity, the voltage at the Dump node is kept close to cp_fb, thereby minimizing the charge injection that occurs when the switches are toggling back and forth between the two sides of primary pump 200, as discussed in further detail in conjunction with FIG. 3 and FIG. 4 below.

Figure 3:
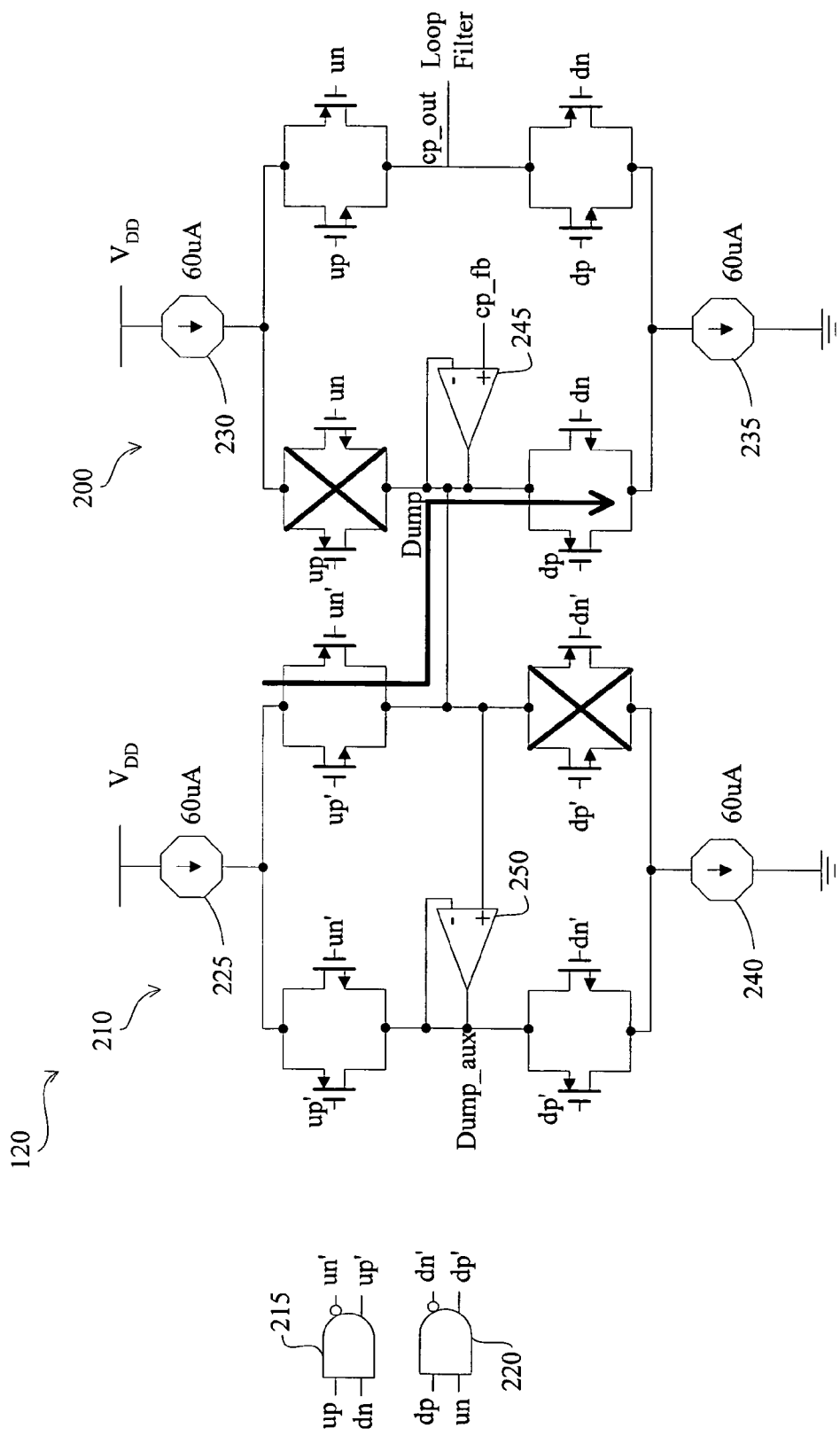
FIG. 3 is a block diagram illustrating the charge pump of the PLL when up arrives before dp.

FIG. 3 is a block diagram illustrating the charge pump 120 of the PLL 100 when up arrives before dp. Initially, the top current source 230 of the CP 200 injects current into the loop filter 125; the bottom current source 235 of the CP 200 draws current from the Dump node; and the top current source 225 of the CP 210 injects current into the Dump node, which prevents Dump from drifting away from cp_fb.

When dp arrives, the top current source 230 of CP 200 injects current into the loop filter 125; the bottom current source 235 of the CP 200 draws current from loop filter 125; and the top current source 225 of CP 225 injects current to the 'Dump_aux' node (because no current is flowing through the left side of CP 200, the voltage at 'Dump' is fixed).

When up and dp return to the low state, the top current source 230 of the CP 200 injects current into the Dump node; and the bottom current source 235 of the CP 200 draws current from Dump node (because the two currents are equal the voltage at the Dump node is fixed).

Figure 4:
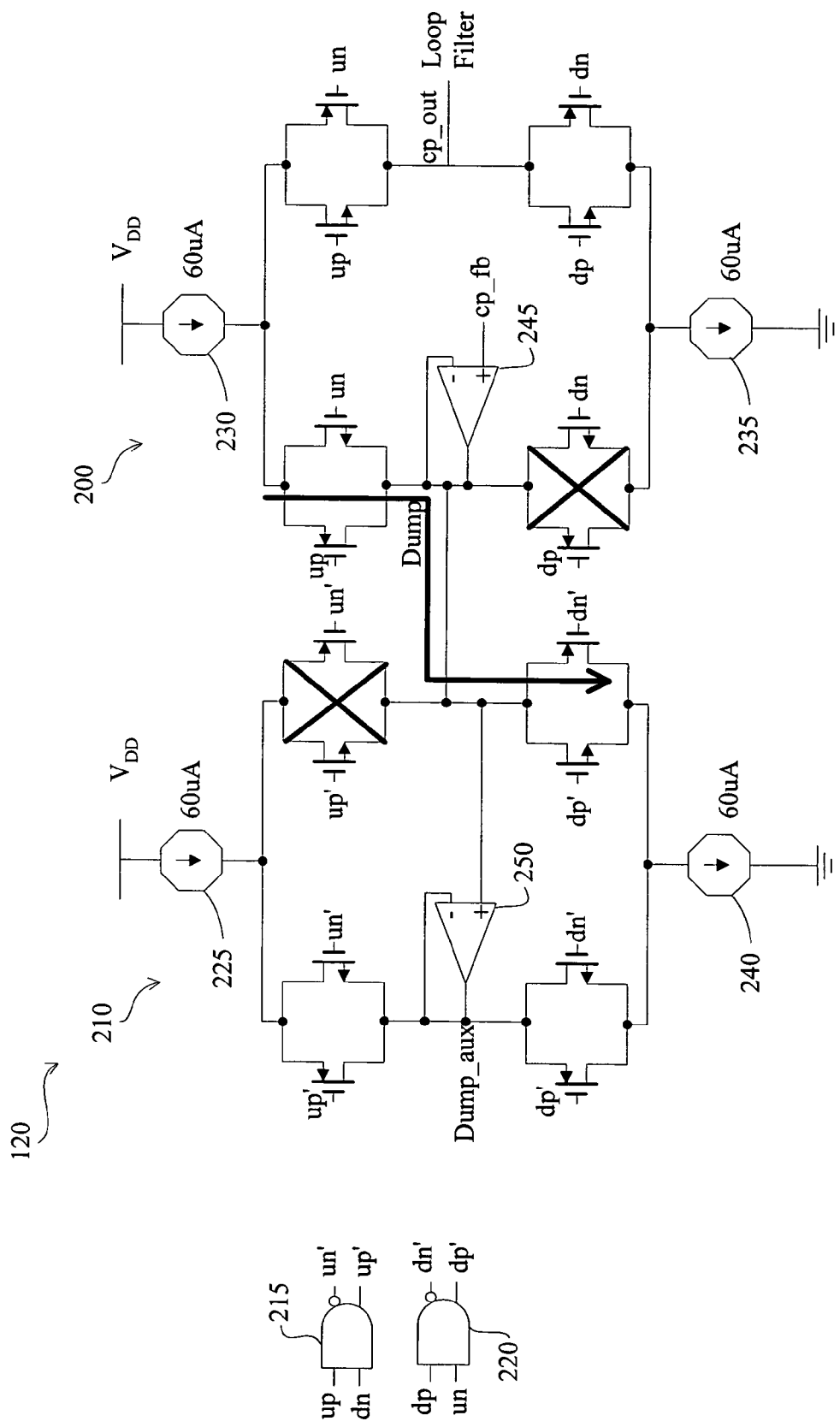
FIG. 4 is a block diagram illustrating the charge pump of the PLL when dp arrives before up.

FIG. 4 is a block diagram illustrating the charge pump 120 of the PLL 100 when dp arrives before up. Initially, the top current source 230 of CP 200 injects current into the Dump node; the bottom current source 235 of the CP 200 draws current from the loop filter 125; and the bottom current source 240 of CP 210 draws current from the Dump node (this prevents 'Dump' from drifting away from cp_fb).

When up arrives, the top current source 230 of the CP 200 injects current into the loop filter 125; the bottom current source 235 of the CP 200 draws current from the loop filter 125; and the bottom current source 240 of CP 210 draws current from the Dump_aux node (because no current is flowing thru the left side of the CP 200, the voltage at the Dump node is fixed)

When up and dp return to the low state, the top current source 200 of the CP 200 injects current into the Dump node; and the bottom current source 235 of the CP 200 draws current from the Dump node (because the two currents are equal the voltage at 'Dump' is fixed).

Figure 5:
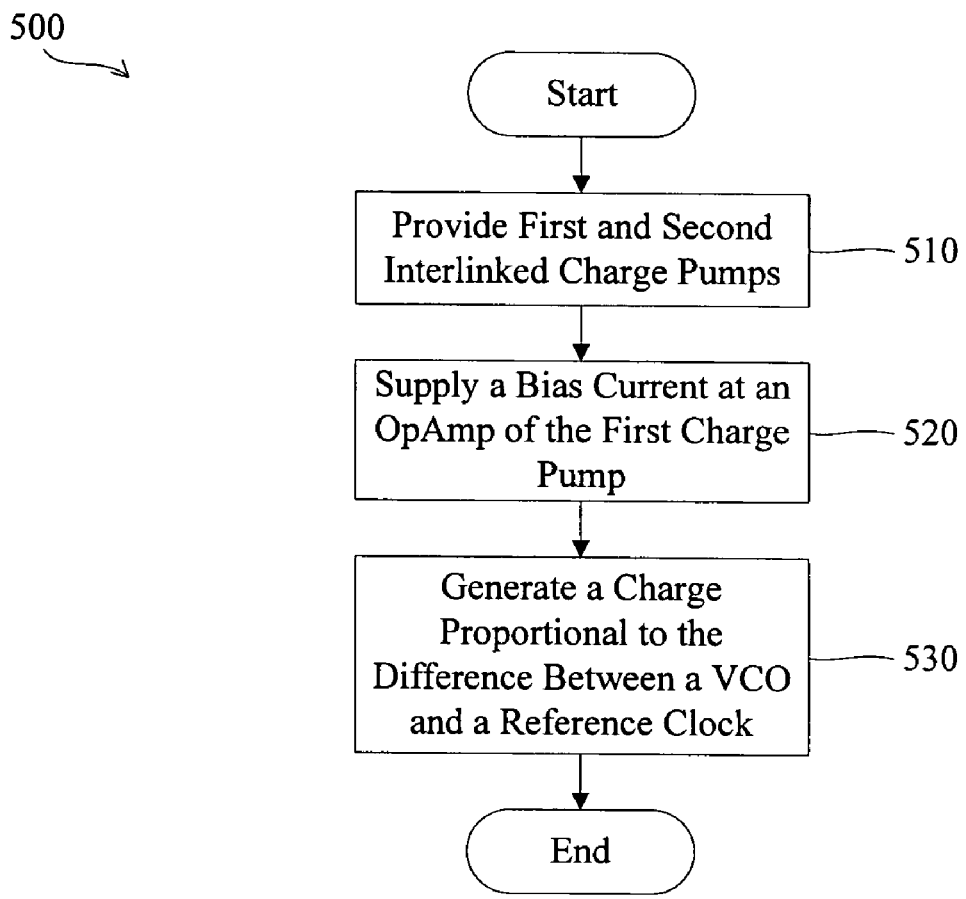
FIG. 5 is a flowchart illustrating a method of generating a charge proportional to the difference between a VCO and a reference clock using two interlinked charge pumps.

FIG. 5 is a flowchart illustrating a method 500 of generating a charge proportional to the difference between a VCO and a reference clock using two interlinked charge pumps. First, charge pumps substantially similar to those described above and shown in the figures should be provided (510). A bias current, less than an input current to the first charge pump, is then supplied (520) to the OpAmp of the primary charge pump. A charge is then generated (530) that is proportional to the difference in phase between a VCO and a reference clock of a PLL. The generated charge can be supplied to a loop filter or otherwise output from the first charge pump. The method 500 then ends.

The foregoing description of the illustrated embodiments of the present invention is by way of example only, and other variations and modifications of the above-described embodiments and methods are possible in light of the foregoing teaching. Components of this invention may be implemented using a programmed general purpose digital computer, using application specific integrated circuits, or using a network of interconnected conventional components and circuits. Connections may be wired, wireless, modem, etc. The embodiments described herein are not intended to be exhaustive or limiting. The present invention is limited only by the following claims.

What is claimed is:

1. A method, comprising:
   providing a first and a second interlinked charge pump;
   supplying an auxiliary bias current at the first pump; and
   generating a charge proportional to a phase difference between a VCO and a reference clock in a PLL,
   wherein the first and second interlinked charge pumps are substantially identical,
   wherein the first and second interlinked charge pumps are configured to permit a current through both the first and the second interlinked charge pump simultaneously, and
   wherein the PLL includes a fractional-N PLL.

2. A method, comprising:
   providing a first and a second interlinked charge pump;
   supplying an auxiliary bias current at the first pump; and
   generating a charge proportional to a phase difference between a VCO and a reference clock in a PLL,
   wherein the first and second interlinked charge pumps are substantially identical,
   wherein the first and second interlinked charge pumps are configured to permit a current through both the first and the second interlinked charge pump simultaneously, and wherein the auxiliary bias current at the first pump is less than an input current at the first pump.

3. A system, comprising:
a first and a second interlinked charge pump; and
a current source coupled to the first pump that supplies an auxiliary bias current;
wherein the charge pumps generate a charge proportional to a phase difference between a VCO and a reference clock in a PLL,
wherein the second interlinked charge pump is substantially identical to the first interlinked charge pump,
wherein the first and second interlinked charge pumps are configured to permit a current through both the first and the second interlinked charge pump simultaneously, and
wherein the PLL includes a fractional-N PLL.

4. A system, comprising:
a first and a second interlinked charge pump; and
a current source coupled to the first pump that supplies an auxiliary bias current;
wherein the charge pumps generate a charge proportional to a phase difference between a VCO and a reference clock in a PLL,
wherein the second interlinked charge pump is substantially identical to the first interlinked charge pump,
wherein the first and second interlinked charge pumps are configured to permit a current through both the first and the second interlinked charge pump simultaneously, and
wherein the auxiliary bias current at the first pump is less than an input current at the first pump.

5. A system, comprising:
a first and a second interlinked charge pump; and
a current source coupled to the first pump that supplies an auxiliary bias current;
wherein the charge pumps generate a charge proportional to a phase difference between a VCO and a reference clock in a PLL,
wherein the second interlinked charge pump is substantially identical to the first interlinked charge pump,
wherein the first and second interlinked charge pumps are configured to permit a current through both the first and the second interlinked charge pump simultaneously, and
wherein a fractional-N PLL incorporating the system.

* * * * *